(12) United States Patent
Inada et al.

(10) Patent No.: US 8,969,851 B2
(45) Date of Patent: Mar. 3, 2015

(54) DETECTION DEVICE, PHOTODIODE ARRAY, AND METHOD FOR MANUFACTURING THE SAME

(75) Inventors: Hiroshi Inada, Osaka (JP); Yasuhiro Iguchi, Osaka (JP); Youichi Nagai, Osaka (JP); Hiroki Mori, Osaka (JP); Kouhei Miura, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 1118 days.

(21) Appl. No.: 12/965,660

(22) Filed: Dec. 10, 2010

(65) Prior Publication Data

US 2011/0147707 A1 Jun. 23, 2011

(30) Foreign Application Priority Data

Dec. 22, 2009 (JP) ................................. 2009-290659

(51) Int. Cl.
*H01L 29/06* (2006.01)
*H01L 27/146* (2006.01)

(52) U.S. Cl.
CPC .... *H01L 27/14636* (2013.01); *H01L 27/14618* (2013.01); *H01L 27/14634* (2013.01); *H01L 27/1469* (2013.01); *H01L 2224/48091* (2013.01); *H01L 2224/73265* (2013.01)
USPC ............... 257/21; 257/E27.137; 257/E31.067

(58) Field of Classification Search
CPC ................... H01L 27/14634; H01L 27/14618; H01L 27/14661
USPC ............. 257/21, E27.137, E27.138, E31.022, 257/E31.067; 438/59
See application file for complete search history.

(56) References Cited

U.S. PATENT DOCUMENTS

| 4,693,770 A | * | 9/1987 | Hatada ........................... 156/151 |
| 6,303,979 B1 | * | 10/2001 | Kasahara ....................... 257/656 |
| 6,406,991 B2 | * | 6/2002 | Sugihara ........................ 438/613 |
| 7,230,247 B2 | * | 6/2007 | Shibayama ............... 250/370.11 |
| 2007/0023777 A1 | * | 2/2007 | Sonobe et al. ................. 257/103 |

FOREIGN PATENT DOCUMENTS

| JP | 03-276750 A | 12/1991 |
| JP | 05-136147 A A | 6/1993 |
| JP | 05-335375 A | 12/1993 |

OTHER PUBLICATIONS

Jiang et al., "Fabrication of indium bumps for hybrid infrared focal plane array applications," Infrared Physics & Technology, vol. 45, pp. 143-151 (2004).

* cited by examiner

*Primary Examiner* — Colleen A Matthews
*Assistant Examiner* — Colleen E Snow
(74) *Attorney, Agent, or Firm* — Venable LLP; Michael A. Santori; George L. Howarah

(57) ABSTRACT

The present invention provides an image pickup device used to capture an image of an object by receiving light in a near infrared region reflected from the object. The image pickup device includes semiconductor light-receiving elements each having a light-receiving layer with a band gap wavelength of 1.65 to 3.0 μm.

15 Claims, 6 Drawing Sheets

DETECTION DEVICE, PHOTODIODE ARRAY, AND METHOD FOR MANUFACTURING THE SAME

BACKGROUND OF THE INVENTION

1. Field of the Invention

The present invention relates to a detection device in which electrodes are connected to each other through a bump, a photodiode array, and a method for manufacturing the detection device.

2. Description of the Related Art

In a detection device including a photodiode array (PDA) formed in a compound semiconductor and a read out IC (ROIC), a read out electrode of the read out IC and an electrode of the photodiode array face each other and are electrically connected to each other through a bump that lies therebetween. In a near infrared region or an infrared region that covers a wavelength longer than that of a visible region, a photodiode array is formed of a compound semiconductor and thus such a detection device is sometimes called a detection device having a hybrid configuration of a compound semiconductor and silicon (IC). Since an epitaxial layered body of the compound semiconductor is vulnerable to mechanical strength, the bump is composed of indium (In), which is soft and has a low melting point, in most cases.

When an electrode of a photodiode array is connected to a read out electrode of ROIC using a indium bump, heating to a high-temperature range is not preferable and thus thermal compression bonding that can be performed under low-temperature heating is employed. Herein, an oxide film is easily formed on the surface of indium, which causes poor electrical conduction, the generation of noise due to an increase in contact resistance, and the detachment between the photodiode array and the ROIC.

To solve the above-described problems, many proposals have been made. For example, to prevent poor contact caused by an oxide film of an In bump in the above-described hybrid configuration, there has been proposed a bump having a layered structure of (indium/gallium/indium) (Patent Document 1: Japanese Unexamined Patent Application Publication No. 3-276750).

To prevent detachment at a connecting point when a hybrid-type infrared image pickup device using an indium bump is manufactured, there has been proposed a method in which metal plating is performed on an electrode of a photodiode array (Patent Document 2: Japanese Unexamined Patent Application Publication No. 5-335375).

Furthermore, it has been proposed that, in the case where an indium bump is formed by vapor deposition, indium is caused to be easily melted by adding a substance that decreases a melting point to indium (Patent Document 3: Japanese Unexamined Patent Application Publication No. 5-136147).

In this method, when a resist pattern is lifted off, an indium alloy on the resist film can be easily separated from an indium alloy on an electrode, whereby an indium bump having a desired shape can be formed on the electrode.

There has been also proposed a method for forming an In bump on a ground metal layer by performing electrolytic plating on an InP wafer using a resist pattern having an opening formed in a portion corresponding to an electrode (Non-Patent Document 1: J. Jiang, S. Tsao, T. O'Sullivan, M. Razeghi, G. J. Brown, "Fabrication of indium bumps for hybrid infrared focal plane array applications", Infrared Physics & Technology 45 (2004) 143-151).

The electrode surfaces of the photodiode array and the ROIC are each constituted by a single flat surface or several flat surfaces. The surface that contacts the indium bump is a flat surface having the maximum area. The electrode surface constituted by the flat surfaces is easily influenced by an oxide film or an impurity such as an organic matter contamination that inhibits the connection. Thus, the contact resistance is easily increased, which causes a variation in the performance between elements and between pixels.

In the method for forming an In bump by electrolytic plating proposed in Non-Patent Document 1, the outer layer of the InP wafer is damaged when the ground metal layer is removed, and charged particles of Ar or the like used in dry etching are left. When the method for forming an In bump is applied to the side of a read out circuit, a circuit element is degraded or becomes abnormal and thus a malfunction is caused on the detection device.

SUMMARY OF THE INVENTION

The present invention relates to a detection device such as a hybrid-type image pickup device in which compression bonding is performed using a bump. An object of the present invention is to provide a detection device in which the contact resistance of electrode/bump is reduced, the bonding strength is increased, and the damage to a main body of a photodiode array or the like is not easily caused.

The detection device of the present invention includes a photodiode array having a plurality of light-receiving elements arranged in a compound semiconductor that has light-receiving sensitivity in a near infrared region and a read out circuit configured to read out a photoinduced charge for each of the light-receiving elements. An electrode of the photodiode array and an electrode of the read out circuit are connected to each other through one or two bumps. In at least one of the photodiode array and the read out circuit, the detection device includes a resin layer that has an opening formed in a portion corresponding to the electrode and covers a surface on the side where the electrode is formed. The detection device of the present invention includes a cup-shaped metal that is formed of a cup-shaped metal layer and covers the electrode and a wall surface of the opening of the resin layer and a bump formed by electrolytic plating and located so as to fill the cup-shaped metal.

Since the bump is located so as to fill the cup-shaped metal, it has a large contact area. Furthermore, since the bump is formed by electrolytic plating, the contact resistance between the bump and the cup-shaped metal can be significantly decreased and the bonding strength between the bump and the cup-shaped metal can be increased. The surface of a layer where the electrode is placed is located at a position lower than the bottom surface of the resin layer. Thus, since the height or depth of the wall surface (cylindrical portion) of the cup-shaped metal, that is, the distance between the surface (upper surface) of the resin layer and the base of the electrode is increased, the bump has a large contact area as described above. Because the cup-shaped metal is formed in a non-oxygenated atmosphere by a conventional method, satisfactory conductivity between the cup-shaped metal and the electrode can be easily provided and the bonding strength can be increased. As a result, satisfactory conductivity and high bonding strength between the bump and the electrode can be achieved.

Herein, the electrode may be an electrode having a shape obtained by exposing a flat surface at a layer where the electrode is placed or may be an electrode having a shape that protrudes from a layer where the electrode is placed. It is obvious from the nature of the present invention that the cup-shaped metal is filled with the bump and furthermore the bump has a portion that protrudes from the cup-shaped metal.

When the cup-shaped metal is locally formed in a portion corresponding to the electrode, dry etching is performed on a portion other than the portion, corresponding to the electrode, of a seed metal layer that covers the entire resin layer. However, since the resin layer is present as a base of the seed metal layer, no damage is caused on the detection device. That is, when the cup-shaped metal is formed by dry etching, the resin layer functions as a damage preventing layer. Consequently, even if the dry etching is performed, a clear image or signal can be obtained.

Since such a deep cup-shaped metal is filled with the bump as described above, the position and shape of the base of the bump are highly precise. The bump is surrounded by the cup-shaped metal layer and grown using the cup-shaped metal and a resist pattern as guides (the growth guide of the resist pattern will be specifically described in the manufacturing method). Therefore, the degree of deviation of the entire shape of the bump can be reduced. In the arrangement of the electrodes at a fine pitch, a short circuit between the adjacent electrodes can be prevented.

Since the base of the bump is formed by electrolytic plating using the cup-shaped metal as an electrode, the base of the bump is securely fixed at a deep position (an effect similar to an anchor effect). Thus, the bump is not easily inclined when contacting the counterpart by compression bonding, whereby compression bonding can be stably performed.

Furthermore, electrolytic plating provides a high deposition rate, and thus the bump can be easily formed in a short period of time.

The read out circuit has the bump formed on the cup-shaped metal by electrolytic plating, and the photodiode array can have one of the following configurations (1) to (3). (1) The photodiode array is connected to the bump of the read out circuit through a bump formed on the electrode of the photodiode array by a gas phase process. (2) No bump is formed on the electrode of the photodiode array and the bump of the read out circuit is directly electrically connected to an electrode of each of the light-receiving elements. (3) The photodiode array is connected to the bump of the read out circuit through a bump formed on the cup-shaped metal of the photodiode array by electrolytic plating.

Thus, according to circumstances, an appropriate bump formation process is performed on the photodiode array including the light-receiving layer or the like having crystallinity that is sometimes subtly affected by the process of bump formation. In this state, the bump formation process of the present invention can be always performed on the read out circuit. In the configuration (1), a bump formation process that has produced many satisfactory results is performed on the photodiode array, whereby the bumps can be compression-bonded to each other without causing such a subtle effect on the inside thereof. In the configuration (2), the connection can be achieved without influencing the crystallinity while the manufacturing process is simplified. In this case, for the bump formed on the read out circuit, the portion that protrudes from the cup-shaped metal is preferably extended, for example. The configuration (3) is effective when the bumps need to be arranged at a very fine pitch with high precision.

The photodiode array of the present invention has a plurality of light-receiving elements arranged in a compound semiconductor that has light-receiving sensitivity in a near infrared region. In this photodiode array, the light-receiving elements each have a pn junction formed by selectively diffusing a p-type impurity from an outer layer of an epitaxial layered body of the compound semiconductor and are separated from each other by a region into which no p-type impurity is selectively diffused. Each of the light-receiving elements includes an electrode formed in a p-type region into which the p-type impurity is selectively diffused so as to achieve ohmic contact. The light-receiving elements of the present invention each include a mask pattern configured to selectively diffuse a p-type impurity, a resin layer located on the mask pattern and having an opening formed in a portion corresponding to the electrode, a cup-shaped metal that is formed of a cup-shaped metal layer and covers a wall surface of the opening of the resin layer and the electrode located at the bottom of the opening, and a bump formed by electrolytic plating and located so as to fill the cup-shaped metal.

The above-described photodiode array is a photodiode array obtained by forming a bump on at least the photodiode array when a detection device is fabricated. The above-described bump and the structure around the bump are the same as those in the detection device described above. Thus, the same effects are produced, but there are a structure and effects that are unique to the photodiode array.

The structure that is unique to the photodiode array is a structure in which a mask pattern (obviously having an opening formed in a portion corresponding to the electrode) for selective diffusion is formed on a window layer or the like that achieves ohmic contact with the electrode, the mask pattern for selective diffusion is left even after a selective diffusion step, and the resin layer is formed on the mask pattern. Thus, in the photodiode array, the surface of a layer where the electrode is placed is located at a position further than the bottom surface of a portion of the resin layer other than the opening, when viewed from the counterpart to be connected. The depth of the cup-shaped metal is increased because the depth is the total thickness of at least the resin layer and the mask pattern that is unique to the photodiode array. Thus, the effects of the deep cup-shaped metal in the detection device can be specifically produced. The mask pattern for selective diffusion is normally composed of SiN.

In the above configuration, even in the photodiode array having a fine pitch, a bump can be formed with a highly precise shape and position, and the damage caused when the cup-shaped metal is formed can be prevented. As a result, a high-quality image can be obtained without causing a short circuit while dark current is reduced.

The resin layer may be located on a passivation film that protects the surface on the side where the electrode is located. For example, this can increase the depth of the cup-shaped metal in the read out circuit, whereby the effects achieved in the detection device can be produced. In the photodiode array, the mask pattern for selective diffusion, the passivation film, and the resin layer are stacked, thereby further increasing the depth of the cup-shaped metal. This can prevent the damage caused by dry etching with more certainty.

The opening of the resin layer may be tapered in the portion corresponding to the electrode. Consequently, the seed metal layer can be easily formed over the surface of the electrode and the wall surface and bottom surface of the opening of the resin layer with certainty.

The resin layer may have a surface roughness Ra of 0.5 to 1.0 μm. This can suppress the crosstalk caused by the reflection, at the surface of the resin layer, of light that has passed through a portion of the photodiode array between pixels. The high roughness at the surface of the resin layer is obtained when the seed metal layer is patterned into the cup-shaped metal by dry etching.

The bump may be composed of In. A high-quality hybrid-type detection device can be manufactured while a bump having a sufficient height is easily formed by electrolytic plating with a highly precise size and position using In that is soft and is easily compression-bonded.

The resin layer may be composed of a photosensitive polyimide resin or a benzocyclobutene (BCB) resin. These resins have photosensitivity and the opening can be easily formed. They also have durability because of their high strength. In addition, a polyimide resin is available at low cost.

The photodiode array includes an InP substrate and a light-receiving layer formed on the InP substrate and having a band gap wavelength of 1.65 to 3.0 µm. The light-receiving layer has a type-II multi-quantum well structure of (GaAsSb/InGaAs) or a type-II multi-quantum well structure of (GaAsSb/InGaAsN), (GaAsSb/InGaAsNP), or (GaAsSb/InGaAsNSb). The light-receiving layer satisfies a lattice matching condition $|\Delta a/a| \leq 0.002$ (where ai is a lattice constant of each layer in the light-receiving layer, a is a lattice constant of the InP substrate, and $\Delta a = ai - a$) so as to achieve lattice matching with the InP substrate. This can provide a detection device used in a near infrared region that has very low dark current and high sensitivity with a high S/N ratio in a long-wavelength region.

The photodiode array includes an InP substrate and a light-receiving layer formed on the InP substrate and having a band gap wavelength of 1.65 to 3.0 µm. The light-receiving layer is composed of InGaAs, InGaAsN, InGaAsNP, or InGaAsNSb. The light-receiving layer satisfies a lattice matching condition $|\Delta a/a| \leq 0.002$ (where ai is a lattice constant of the light-receiving layer, a is a lattice constant of the InP substrate, and $\Delta a = ai - a$) so as to achieve lattice matching with the InP substrate. This light-receiving layer having a simple structure can provide a detection device used in a near infrared region that has very low dark current and a high S/N ratio.

A typical electronic apparatus includes a plurality of electrodes and a plurality of bumps disposed for the respective electrodes. In contrast, the electronic apparatus of the present invention includes a resin layer that has an opening formed in a portion corresponding to an electrode and covers a surface on the side where the electrode is formed. The electronic apparatus includes a cup-shaped metal that is formed of a cup-shaped metal layer and covers the electrode and a wall surface of the opening of the resin layer and a bump formed by electrolytic plating and located so as to fill the cup-shaped metal.

Since the bump has a large contact area with the cup-shaped metal and is formed by electrolytic plating, the contact resistance between the bump and the cup-shaped metal can be significantly decreased and the bonding strength between the bump and the cup-shaped metal can be increased. Since the surface of a layer where the electrode is placed is located at a position lower than the bottom surface of the resin layer, the bump has a large contact area with the cup-shaped metal. As a result, satisfactory conductivity and high bonding strength between the bump and the electrode can be achieved. Herein, the electrode may be an electrode having a shape obtained by exposing a flat surface at a layer where the electrode is placed or may be an electrode having a shape that protrudes from a layer where the electrode is placed.

When the cup-shaped metal is locally formed in a portion corresponding to the electrode, dry etching is performed on a portion other than the portion, corresponding to the electrode, of the seed metal layer that covers the entire resin layer. Since the resin layer is present as a base of the seed metal layer, no damage is caused on the electronic apparatus. That is, when the cup-shaped metal is formed by dry etching, the resin layer functions as a damage preventing layer. Consequently, even if the dry etching is performed, an electronic apparatus or the like having no damage can be obtained.

Since the deep cup-shaped metal is filled with the bump, the position and shape of the base of the bump are highly precise and the bump is surrounded by the cup-shaped metal layer. Thus, the bump is grown using the cup-shaped metal and a resist pattern as guides. Therefore, the degree of deviation of the entire shape of the bump can be reduced. In the arrangement of the electrodes at a fine pitch, a short circuit between the adjacent electrodes can be prevented.

Since the base of the bump is formed by electrolytic plating using the cup-shaped metal as an electrode, the base is securely fixed at a deep position, which provides an effect similar to an anchor effect. As a result, the bump is not easily inclined when contacting the counterpart by thermal compression bonding, whereby thermal compression bonding can be stably performed. Furthermore, electrolytic plating provides a high deposition rate, and thus the bump can be easily formed in a short period of time.

Another typical electronic apparatus is a hybrid-type electronic apparatus that includes a first semiconductor chip and a second semiconductor chip, wherein an electrode of the first semiconductor chip is connected to an electrode of the second semiconductor chip through one or two bumps. In at least one of the first semiconductor chip and the second semiconductor chip, this electronic apparatus includes a resin layer that has an opening formed in a portion corresponding to the electrode and covers a surface on the side where the electrode is formed. The electronic apparatus includes a cup-shaped metal that is formed of a cup-shaped metal layer and covers the electrode and a wall surface of the opening of the resin layer and a bump formed by electrolytic plating and located so as to fill the cup-shaped metal.

According to the above configuration, there can be provided a high-quality hybrid-type electronic apparatus in which thermal compression bonding is easily performed, a high fabrication yield is achieved, no damage is caused, and the one-to-one connection of bumps are achieved with high precision.

In the typical electronic apparatus, the resin layer may also be located on a passivation film that protects the surface on the side where the electrode is located. This can increase the depth of the cup-shaped metal and prevent the damage caused by dry etching with more certainty.

In the typical electronic apparatus, the opening of the resin layer may also be tapered in the portion corresponding to the electrode. Consequently, the seed metal layer can be easily formed over the surface of the electrode and the wall surface and bottom surface of the opening of the resin layer with certainty.

In the typical electronic apparatus, the bump may also be composed of In. A high-quality hybrid-type electronic apparatus can be manufactured while a bump having a sufficient height is easily formed by electrolytic plating with a highly precise size and position using In that is soft and is easily compression-bonded.

In the typical electronic apparatus, the resin layer may also be composed of a photosensitive polyimide resin or a benzocyclobutene (BCB) resin. These resins have photosensitivity and the opening can be easily formed. They also have durability because of their high strength. In addition, a polyimide resin is available at low cost.

In a method for manufacturing a detection device of the present invention, there is manufactured a detection device including a photodiode array having a plurality of light-receiving elements arranged in a compound semiconductor that has light-receiving sensitivity in a near infrared region and a read out circuit configured to read out a photoinduced charge for each of the light-receiving elements, an electrode of the photodiode array and an electrode of the read out circuit being connected to each other through one or two bumps. This manufacturing method includes a step of preparing a read out circuit with a protective film having an opening formed in a portion corresponding to an electrode of the read out circuit so that the protective film covers a surface on the side where the electrode is formed; a step of forming a resin layer that covers the protective film and has an opening formed in a portion corresponding to the electrode of the read out circuit; a step of forming a seed metal layer so that the seed metal layer covers the electrode, an upper surface of the resin layer, and a wall surface of the opening of the resin layer; a step of forming a resist pattern on the seed metal layer, the resist pattern sharing the opening; a step of growing a bump in the opening by electrolytic plating using the seed metal layer as an electrode for electrolytic plating so that the opening is filled with the bump; and a step of forming a cup-shaped metal in the opening by removing the resist pattern and removing a portion of the seed metal layer other than the opening using dry etching.

In the above method, when the cup-shaped metal is formed by dry etching, no damage is caused on the detection device because the resin layer is present as a base of the seed metal layer. That is, the resin layer functions as a damage preventing layer. Consequently, even if the dry etching is performed, a clear image or signal can be obtained. In the bump, low contact resistance, high bonding strength, highly precise shape, high deposition rate of a bump, high roughness at the surface of a resin layer, and the like are the same as described above.

The method for manufacturing a detection device may further include a step of forming a bump on an electrode of a photodiode array by a gas phase process and a step of compression-bonding the bump of the photodiode array to the bump of the read out circuit. Consequently, the effect (1) described above can be produced.

The method for manufacturing a detection device of the present invention may further include a step of directly compression-bonding the bump of the read out circuit to an electrode of a photodiode array. Consequently, the effect (2) described above can be produced.

The method for manufacturing a detection device of the present invention, the detection device including a photodiode array having a mask pattern for selectively diffusing an impurity used to form a light-receiving element, the mask pattern having an opening formed in a portion corresponding to an electrode of the photodiode array, the method including a step of forming a resin layer on the mask pattern, the resin layer having an opening formed in a portion corresponding to the electrode of the photodiode array; a step of forming a seed metal layer so that the seed metal layer covers the electrode, an upper surface of the resin layer, and a wall surface of the opening of the resin layer; a step of forming a resist pattern on the seed metal layer, the resist pattern sharing the opening; a step of growing a bump in the opening by electrolytic plating using the seed metal layer as an electrode for electrolytic plating so that the opening is filled with the bump; a step of forming a cup-shaped metal in the opening by removing the resist pattern and removing a portion of the seed metal layer other than the opening using dry etching; and a step of compression-bonding the bump of the photodiode array to the bump of the read out circuit. Consequently, the effect (3) described above can be produced.

According to the present invention, in a detection device such as a hybrid-type image pickup device in which compression bonding is performed using a bump, the contact resistance of electrode/bump can be reduced, the bonding strength can be increased, and the damage to a main body of a photodiode array or the like is not easily caused.

DESCRIPTION OF THE PREFERRED EMBODIMENTS

First Embodiment

Figure 1:
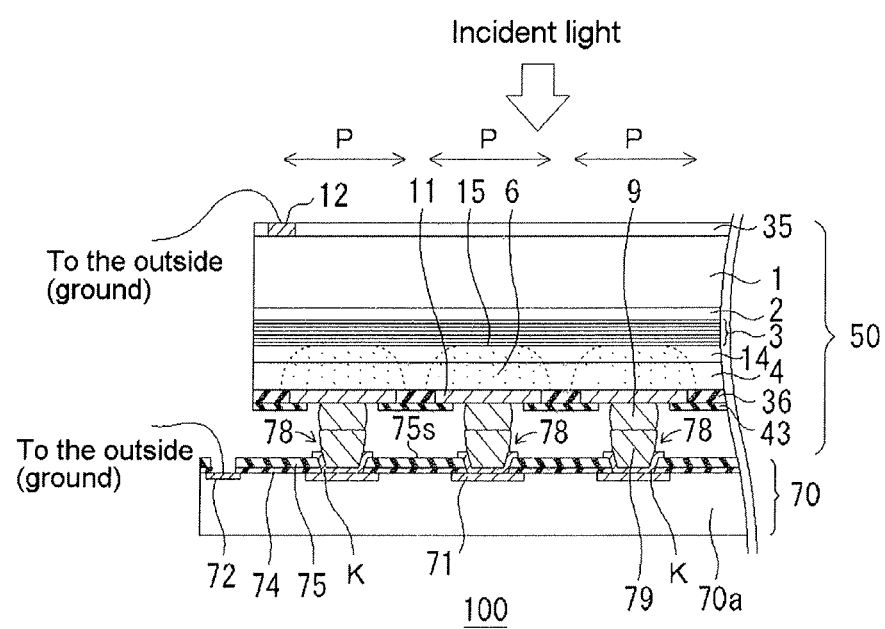
FIG. 1 is a sectional view showing a detection device according to a first embodiment of the present invention.

FIG. 1 is a sectional view showing a detection device 100 according to a first embodiment of the present invention. The feature of this embodiment is a structure of a base of a bump 79 located on an electrode 71 of a complimentary metal oxide semiconductor (CMOS) 70 that constitutes a read out circuit. This feature will be specifically described after the outline of the entire configuration is described.

A photodiode array 50 is formed as a layered body of n-type InP substrate 1/n-type $In_{0.53}Ga_{0.47}As$ buffer layer 2/light-receiving layer (light-absorbing layer) 3/diffusion concentration distribution control layer 14/InP cap layer 4. In each of light-receiving elements, zinc (Zn) that is a p-type impurity is selectively diffused to form a p-type region 6, and a pn junction 15 is formed at the edge portion of the p-type region 6.

The p-type region 6 that mainly constitutes the light-receiving element of a pixel P is separated from the adjacent p-type region 6 by a region into which no p-type impurity is selectively diffused. Thus, a photodiode array 50 having low dark current can be obtained with a simple structure without forming a mesa structure.

Any compound semiconductor may be used for the light-receiving layer 3 as long as the compound semiconductor has light-receiving sensitivity at a wavelength of 1 to 3 µm. For example, any one of InGaAs, InGaAsN, InGaAsNP, and InGaAsNSb may be used. In this embodiment, an example of a type-II multi-quantum well (MQW) structure is described. In FIG. 1, in the case where the light-receiving layer 3 has a type-II MQW structure, the diffusion concentration distribution control layer 14 is formed on the InP cap layer 4 side in order to reduce the Zn concentration in the MQW to a certain level or lower when zinc (Zn) that is a p-type impurity is diffused. A specific structure obtained in the case where the light-receiving layer 3 has a type-II MQW structure will be described later. The read out circuit of a hybrid detection device 100 is constituted by the CMOS 70 including a read out electrode 71.

An anti-reflection film 35 composed of SiON is formed on the bottom surface of the InP substrate 1 that is a light incident surface. A selective diffusion mask pattern 36 composed of SiN and used to perform selective diffusion for forming the p-type region 6 is left as it is. Furthermore, a passivation film 43 is formed that covers the opening of the selective diffusion mask pattern 36 or the surface of the InP cap layer 4 and the selective diffusion mask pattern 36.

In the photodiode array 50, each of the p-type regions 6 corresponds to a main portion of the pixel P, and a p-side electrode 11 functions as a pixel electrode. All n-side electrodes 12 corresponding to the pixel electrodes 11 have a common ground potential, and a ground electrode 72 that is a counterpart in the CMOS 70 also has a ground potential.

1. Bump 79 of CMOS 70

The CMOS 70 is coated with a protective film 74 having an opening 78 formed in a portion corresponding to the electrode 71. A resin layer 75 covers the protective film 74 and the end faces of the protective film 74 so as to be in contact with the protective film 74 and share the opening 78 of the protective film 74. Thus, the resin layer 75 covers the wall surface of the opening 78. A cup-shaped metal K is located at the opening 78 and electrically connected to the electrode 71. A bump 79 is formed so that the cup-shaped metal K is filled with the bump 79 and the bump 79 protrudes from the cup-shaped metal K. The bump 79 formed on the CMOS 70 is electrically connected to a bump 9 formed on the p-side electrode 11 of the photodiode array 50 by compression bonding. The bump 9 disposed on the p-side electrode 11 of the photodiode array 50 is formed by a gas phase process using photolithography. When the bump 9 is formed by a gas phase process, the crystallinity of the light-receiving layer 3, the cap layer 4, or the like of the photodiode array 50 is not influenced.

Figure 2:
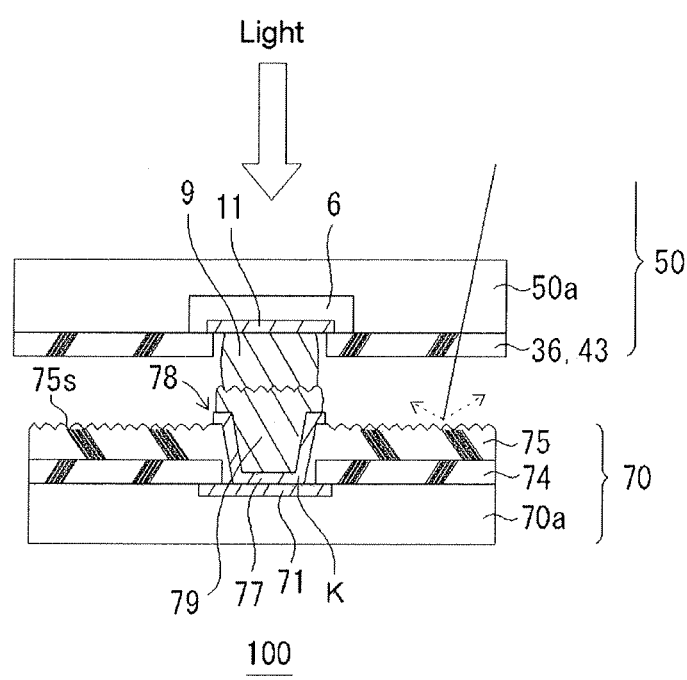
FIG. 2 shows an action that suppresses crosstalk with a high-roughness surface of a resin layer in the detection device shown in FIG. 1.

FIG. 2 is an enlarged sectional view of the bumps 9 and 79 in the detection device 100 shown in FIG. 1. The bump 79 formed on the CMOS 70 is located so as to fill the cup-shaped metal K. Therefore, since the bump 79 formed on the CMOS 70 has a large contact area with the cup-shaped metal K and is formed by electrolytic plating, the contact resistance between the bump 79 and the cup-shaped metal K is significantly low. Furthermore, the bonding strength between the bump 79 and the cup-shaped metal K can be increased. Whether the bump has been formed by electrolytic plating or a gas phase process can be easily determined by observing a microstructure of the section of the bump using an optical microscope or the like. This can also be determined by visual inspection.

The layer on which the electrode is placed is an top layer of a CMOS main body 70a and is coated with the protective film 74. The surface of the CMOS main body 70a is located at a position lower than the bottom surface of the resin layer 75 formed on the protective film 74 by the thickness of the protective film 74. Thus, since the height or depth of the wall surface (cylindrical portion) of the cup-shaped metal K, that is, the distance between the surface (upper surface) 75s of the resin layer 75 and the electrode 71 is increased, the bump 79 has a large contact area with the cup-shaped metal K as described above.

Because the cup-shaped metal K is formed in a non-oxygenated atmosphere by a conventional method, satisfactory conductivity between the cup-shaped metal K and the electrode can be provided and the bonding strength can be increased. As a result, satisfactory conductivity and high bonding strength between the bump 79 and the electrode 71 can be achieved.

Herein, in the opening 78, the electrode 71 may be an electrode having a shape obtained by exposing a flat surface at the surface of the CMOS main body 70a or the layer where the electrode 71 is placed or may be an electrode having a shape that protrudes from the layer where the electrode 71 is placed. The bump 79 has a configuration in which the cup-shaped metal K is filled with the bump 79 while the bump 79 covers the electrodes having various shapes and the bump 79 further has a portion that protrudes from the cup-shaped metal K. The bump 79 may protrude from the cup-shaped metal K to a large extent and is suitably used as a bump 79 in a second embodiment, for example.

Although described in the manufacturing method, when the cup-shaped metal K is locally formed in a portion corresponding to the electrode 71, dry etching is performed on a portion other than the portion, corresponding to the electrode 71, of a seed metal layer that covers the entire resin layer 75. Since the resin layer 75 is present as a base of the seed metal layer, no damage is caused on the CMOS 70. That is, when the cup-shaped metal K is formed by dry etching, the resin layer 75 functions as a damage preventing layer. Consequently, even if the dry etching is performed, no damage is caused and a clear image or signal can be obtained.

Since the deep cup-shaped metal K is filled with the bump 79, the position and shape of the base of the bump 79 are highly precise. The bump 79 is surrounded by the cup-shaped metal layer and grown using the cup-shaped metal K and a resist pattern as guides (the growth guide of the resist pattern will be specifically described in the manufacturing method). Therefore, the degree of deviation of the entire shape and position of the bump 79 can be reduced, that is, high precision can be achieved. In the arrangement of the electrodes 71 at a fine pitch, a short circuit between the adjacent electrodes 71 can be prevented.

The base of the bump 79 is formed by electrolytic plating using the cup-shaped metal K as an electrode. Thus, the base of the bump 79 is securely fixed at a deep position (an effect similar to an anchor effect) and the bump 79 is not easily inclined when contacting the counterpart by thermal compression bonding, whereby compression bonding can be stably performed.

Furthermore, electrolytic plating provides a high deposition rate, and thus the bump can be easily formed in a short period of time.

2. Manufacturing Method

Figure 3A:
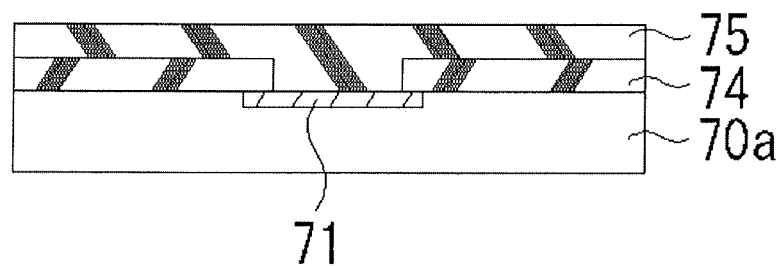
FIG. 3A shows a state in which a resin layer is formed on a protective film of a CMOS in a method for manufacturing the detection device shown in FIG. 1.

FIGS. 3A to 3C and 4A to 4C show a method for manufacturing a bump 79 formed on a CMOS 70 in a detection device 100 of this embodiment. First, a CMOS 70 having an electrode 71 that is exposed at the top layer of a CMOS main body 70a is prepared. In this CMOS 70, a protective film 74 having an opening formed in a portion corresponding to the electrode 71 covers the surface of the CMOS main body 70a. As shown in FIG. 3A, the entire protective film 74 is then coated with a resin layer 75 having a thickness of about 1 to 2 μm. For the resin layer 75, a photosensitive resin composed of a polyimide resin or a BCB resin can be used.

Figure 3B:
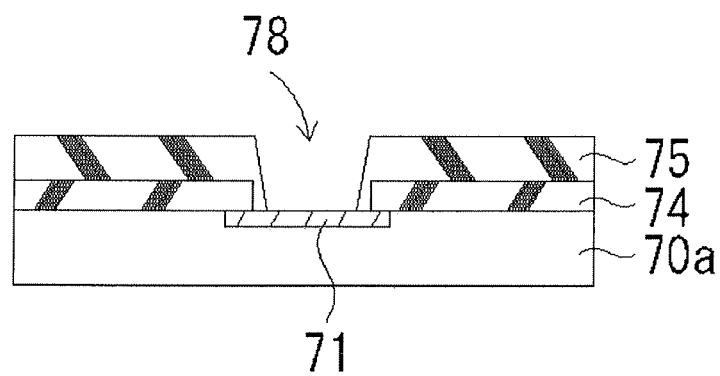
FIG. 3B shows a state in which an opening is formed in a portion corresponding to an electrode in the method for manufacturing the detection device shown in FIG. 1.

Subsequently, as shown in FIG. 3B, a portion of the resin layer 75 corresponding to the electrode 71 is removed by development in a photolithography process to form an opening 78. Polyimide and BCB are photosensitive resins, and the opening 78 can be formed by exposing and developing the resin. The opening 78 is preferably tapered so that the area of the section is increased outward. In the case where, for example, a photosensitive polyimide resin is used for the resin layer 75, the conditions used when forming an opening having an appropriate tapered shape are as follows. The photosensitive polyimide is applied at 1000 to 2000 rpm, prebaked for 30 minutes, exposed at 1000 mJ/cm$^2$, developed for 7 to 10 minutes (at a temperature of 20 to 21° C.), and cured at 300 to 320° C. for 30 minutes.

Figure 3C:
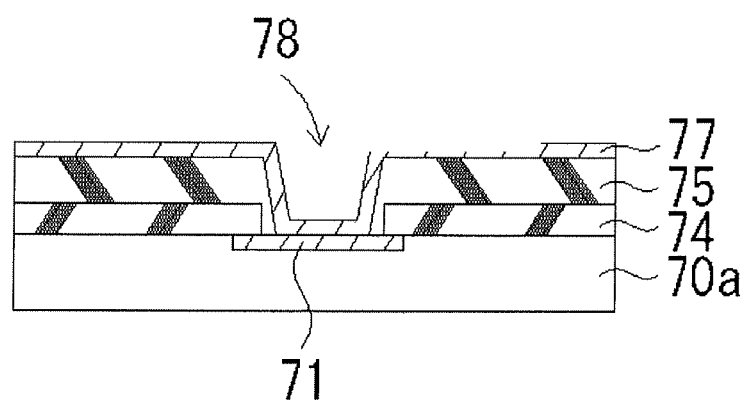
FIG. 3C shows a state in which a seed metal layer is formed in the method for manufacturing the detection device shown in FIG. 1.

Next, as shown in FIG. 3C, a seed metal layer 77 is formed so as to cover the resin layer 75 and the opening 78. A metal of the seed metal layer 77 may be composed of Ti/W, Ti/Pt/Au, or the like. The seed metal layer 77 can be formed by any conventional method such as a sputtering method or an electron beam evaporation method. The seed metal layer 77 can be used as an electrode for electrolytic plating when it is present in a sheet form before being divided into individual cup-shaped metals. An electrolytic solution of electrolytic plating is in contact with the depressed or cup-shaped seed metal layer 77 exposed at the opening 78. An In layer is formed through an electrochemical reaction using the contact portion as an electrode (anode).

Figure 4A:
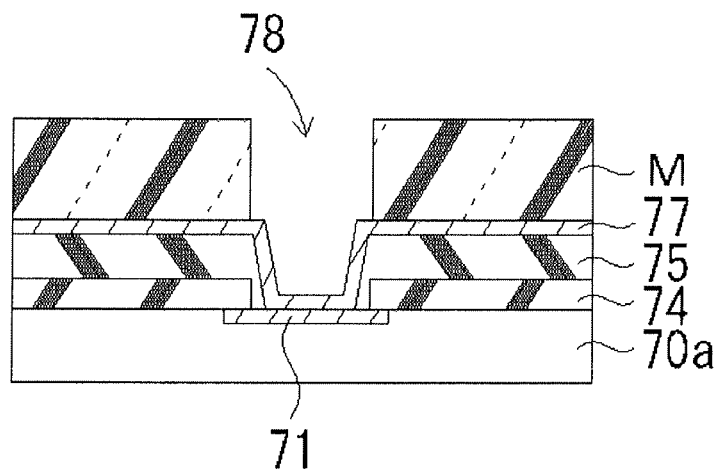
FIG. 4A shows a state in which a resist pattern sharing the opening is formed in the manufacturing step performed after the steps shown in FIGS. 3A to 3C.
Figure 4B:
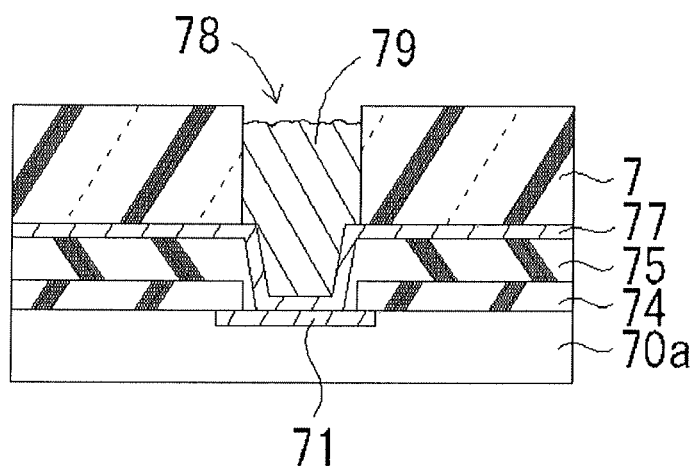
FIG. 4B shows a state in which a bump is formed on the seed metal layer of the opening by electrolytic plating in the manufacturing step performed after the steps shown in FIGS. 3A to 3C.

Subsequently, as shown in FIG. 4A, a resist pattern M sharing the opening 78 is formed. The thickness of the resist pattern M is adjusted so that the upper surface of the resist pattern M is higher than the edge portion of a bump 79 to be formed. For example, the resist pattern M has a thickness of 10 μm. A bump 79 composed of indium or the like is grown using the seed metal layer 77 as one electrode (anode) and indium or the like as the other electrode (cathode) on a portion exposed from the resist pattern M, that is, on the seed metal layer 77 in the opening 78 by electrolytic plating. The bump 79 starts to grow from the seed metal layer 77 exposed at the opening 78 and is caused to grow until the bump 79 protrudes from the opening 78 or depressed portion of the seed metal layer 77. As shown in FIG. 4B, the electrolytic plating may be ended when the edge of the bump 79 is within the opening 78 of the resist pattern M. The opening 78 of the resist pattern M serves as a useful guide for the growth of the bump 79, and the bump 79 can be formed with high precision. Thus, by using the configuration 79, 75, and K regarding the bump according to this embodiment for a photodiode array having a fine pitch, a high-quality image having no short circuit can be obtained.

Figure 4C:
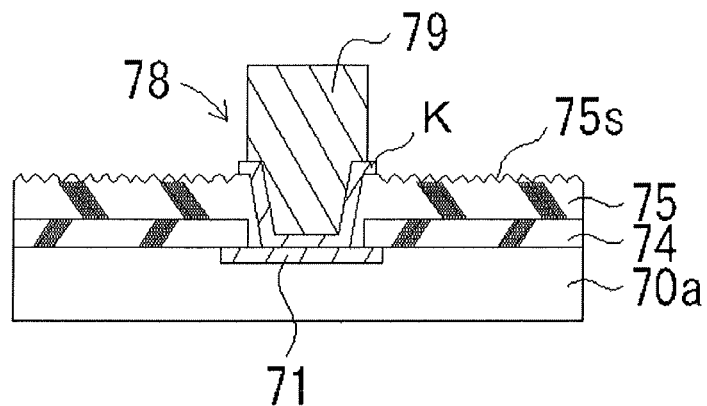
FIG. 4C shows a state in which the resist pattern is removed and a portion of the seed metal layer other than the opening is removed by dry etching in the manufacturing step performed after the steps shown in FIGS. 3A to 3C.

Next, as shown in FIG. 4C, the resist pattern M is removed, and a portion of the seed metal layer 77 other than the opening 78 is removed by dry etching. If the resin layer 75 is not present, dry etching may cause damage to the CMOS main body 70a. However, in the present invention, since the resin layer 75 is disposed as a base of the seed metal layer 77, the damage to the CMOS main body 70a can be prevented. Moreover, the surface 75s of the resin layer 75 has a high roughness after this dry etching. The roughness Ra is 0.5 to 1 μm. To achieve such a roughness, dry etching is performed at a power of 200 to 500 W at a pressure of 1 to 3 Pa.

After that, the CMOS 70 is compression-bonded, in a heated atmosphere or at room temperature, to a photodiode array 50 having a bump 9 formed on a p-side electrode 11 by a gas phase process while the bumps 9 and 79 face each other.

3. Resin Layer 75

As described above, the base of the bump 79 formed on the read out electrode 71 of the CMOS 70 has a structure of surface of CMOS main body 70a/protective film 74/resin layer 75/cup-shaped metal K in opening 78.

As shown in FIG. 2, the surface 75s of the resin layer 75 faces the photodiode array 50. When light is incident on the back side of a substrate of the photodiode array 50, light that is incident on a portion constituting a pixel is converted into a photoinduced charge in the light-receiving layer 3 of a main body 50a at a certain conversion efficiency and read out in the read out electrode 71. However, light that is not converted reaches the resin layer 75 through the above-described selective diffusion mask pattern 36 and passivation film 43. If the resin layer 75 has a smooth surface, the light that has reached the resin layer 75 is reflected on the surface of the resin layer 75 and returned to the photodiode array 50. As a result, such light is converted into a photoinduced charge, for example, in the adjacent light-receiving element or pixel at a certain ratio. That is, crosstalk through the surface of the resin layer 75 or the CMOS main body 70a is caused. Cross talk needs to be suppressed as much as possible because it degrades the sharpness or quality of an image.

In this embodiment, as described above, the surface 75s of the resin layer 75 has a high roughness Ra of 0.5 to 1 μm due to dry etching. Therefore, as shown in FIG. 2, even if the light that has passed through the selective diffusion mask pattern 36 and the passivation film 43 from the photodiode array 50 side reaches the surface 75s, the light is not properly reflected but scattered because of the high roughness of the surface 75s. This can significantly reduce the amount of light that is returned to the photodiode array 50 side, which can considerably suppress crosstalk. The resin layer 75 has a simple structure, but produces various and important effects on the connection between electrodes including the bumps 9 and 79 therebetween. The major effects of the resin layer 75 are summarized as follows.

(E1) When the cup-shaped metal K is formed by performing dry etching on the seed metal layer 77, the damage to the main body 70a is prevented.

(E2) By increasing the thickness of the resin layer 75, the contact resistance between the cup-shaped metal K and the bump 79 is decreased and the bonding strength between the cup-shaped metal K and the bump 79 is increased. In short, the thickness of the resin layer 75 contributes to producing most of the depth of the cup-shaped metal K (but not all).

(E3) In the form of a detection device, by increasing the roughness of the surface 75s of the resin layer 75, crosstalk in the photodiode array 50 can be significantly suppressed.

4. Photodiode Array 50

The light-receiving layer 3 of the photodiode array 50 according to this embodiment will be specifically described. In FIG. 1, a light-receiving element of each of pixels P has a group III-V semiconductor layered structure (epitaxial wafer) of (InP substrate 1/n-type buffer layer 2/light-receiving layer 3 having type-II MQW structure of InGaAs and GaAsSb/diffusion concentration distribution control layer 14/InP cap layer 4).

The p-type region 6 located so as to reach the light-receiving layer 3 having an MQW structure from the InP cap layer 4 is formed by selectively diffusing Zn, which is a p-type impurity, from the opening of the selective diffusion mask pattern 36 that is a SiN film. The diffusion introduction into the inside of the periphery of each pixel in a limited manner when viewed in plan can be achieved by diffusion using the selective diffusion mask pattern 36 that is a SiN film. Because the diffusion is performed in a limited manner, the p-type region 6 is separated by a region into which no p-type impurity is selectively diffused. The n-type buffer layer 2 may be composed of a semiconductor such as InP or InGaAs.

To achieve ohmic contact and a certain degree of strength, the p-side electrode 11 of a pixel electrode may be formed of Au/Zn/Au/Ti/Au. An n-side electrode 12 composed of AuGeNi/Ti/Au is formed on the InP substrate 1 so as to achieve ohmic contact (refer to FIG. 1).

In the light-receiving layer 3 having a type-II MQW structure, a pn junction 15 is formed at a position corresponding to a boundary front of the p-type region 6. By applying a reverse bias voltage between the bump 9 and the n-side electrode 12, a larger depletion layer is formed on the side where the n-type impurity concentration is low (n-type impurity background).

The background in the light-receiving layer 3 having a type-II MQW structure has an n-type impurity concentration (carrier concentration) of about $5 \times 10^{15}/cm^3$ or less. The position of the pn junction 15 is determined by the intersection between the background (n-type carrier concentration) of the light-receiving layer 3 having an MQW structure and the concentration profile of Zn, which is a p-type impurity. The diffusion concentration distribution control layer 14 may be inserted between the light-receiving layer 3 and the cap layer 4 in order to achieve satisfactory electrical conductivity between the light-receiving layer 3 and the bump 9 without impairing the crystallinity of the light-receiving layer 3 due to the introduction of a p-type impurity performed by selective diffusion. The Zn concentration is increased in a portion of the diffusion concentration distribution control layer 14 on the cap layer 4 side and, as described above, the Zn concentration is decreased in a portion on the light-receiving layer 3 side. In the diffusion concentration distribution control layer 14, the concentration of the p-type impurity selectively diffused from the surface of the InP cap layer 4 is steeply declined from the InP cap layer 4 side having a high concentration of $1 \times 10^{18}/cm^3$ or more toward the light-receiving layer 3 side. The diffusion concentration distribution control layer 14 may be formed of $In_{0.53}Ga_{0.47}As$ whose electrical resistance is not easily increased even if there is a portion (a certain portion on the light-receiving layer 3 side) where the impurity concentration is low due to relatively low band gap energy. The diffusion concentration distribution control layer 14 may not be necessarily formed, but should be formed to achieve satisfactory crystallinity of the light-receiving layer 3 having an MQW structure.

By inserting the above-described diffusion concentration distribution control layer 14, a Zn concentration (impurity concentration) of $5 \times 10^{16}/cm^3$ or less can be easily and stably achieved in the light-receiving layer 3. The photodiode array 50 according to the present invention is intended to have light-receiving sensitivity at a wavelength longer than that in a near infrared region. Therefore, the cap layer 4 is preferably composed of a material having a band gap energy higher than that of the light-receiving layer 3. Thus, the cap layer 4 is normally composed of InP that has a band gap energy higher than that of the light-receiving layer 3 and good lattice matching. Alternatively, InAlAs having substantially the same band gap energy as that of InP may be used.

The light-receiving layer 3 preferably has a type-II MQW structure. In a type-I quantum well structure, the light-receiving sensitivity is provided in a near infrared region by sandwiching a semiconductor layer having a low band gap energy between semiconductor layers having a high band gap energy. In this light-receiving element, the upper limit of a wavelength (cutoff wavelength) of light-receiving sensitivity is determined by a band gap of the semiconductor layer having a low band gap energy. In other words, the transition of electrons or holes caused by light is performed in the semiconductor layer having a low band gap energy (direct transition). In this case, among group III-V compound semiconductors, a material whose cutoff wavelength is extended to longer wavelengths is significantly limited. In contrast, in a type-II MQW structure, when two types of different semiconductor layers having common Fermi energy are alternately stacked, the upper limit of a wavelength (cutoff wavelength) of light-receiving sensitivity is determined by the energy difference between the conduction band of a first semiconductor and the valence band of a second semiconductor. In other words, the transition of electrons or holes caused by light is performed between the valence band of a second semiconductor and the conduction band of a first semiconductor (indirect transition). Thus, by setting the energy of the valence band of a second semiconductor to be higher than that of the valence band of a first semiconductor and setting the energy of the conduction band of a first semiconductor to be lower than that of the conduction band of a second semiconductor, the light-receiving sensitivity at longer wavelengths is easily achieved compared with the case of direct transition in a single semiconductor.

As described above, a p-type impurity is introduced into the inside of the periphery of each light-receiving element in a limited manner when viewed in plan through selective diffusion using the selective diffusion mask pattern 36. Therefore, the pn junction 15 is not exposed at the end face of the light-receiving element. As shown in FIG. 1, a plurality of pixels P are arranged without forming element separation grooves therebetween. As described above, the p-type region 6 is limited inside each of the pixels P and the adjacent pixels P are separated from each other by a region into which no p-type impurity is selectively diffused, whereby the pixels P are isolated from each other with certainty. As a result, the leakage of photocurrent is suppressed.

An n-type InGaAs buffer layer 2 (or n-type InP buffer layer 2) is formed on the InP substrate 1 so as to have a thickness of 2 μm. A light-receiving layer 3 having a multi-quantum well structure of (InGaAs/GaAsSb) or (InGaAsN/GaAsSb) is then formed. To achieve lattice matching with InP, the composition of InGaAs is set to be $In_{0.53}Ga_{0.47}As$ and the composition of GaAsSb is set to be $GaAs_{0.52}Sb_{0.48}$. This allows the degree of lattice matching ($|\Delta a/a|$, where a is a lattice constant of the InP substrate and $\Delta a = ai - a$ (ai is a lattice constant of each layer) is the difference in lattice constant between the InP substrate and the light-receiving layer) to be 0.002 or less.

An InGaAs layer and a GaAsSb layer constituting a unit quantum well structure each have a thickness of 5 nm and the number of pairs thereof (the number of repeated unit quantum wells) is 250. An $In_{0.53}Ga_{0.47}As$ layer is then formed, as a diffusion concentration distribution control layer 14 used when Zn is introduced by diffusion, on the light-receiving layer 3 through epitaxial growth so as to have a thickness of 1 μm, and finally an InP cap layer 4 is formed through epitaxial growth so as to have a thickness of 1 μm. The light-receiving layer 3 and the diffusion concentration distribution control layer 14 are preferably formed through epitaxial growth by molecular beam epitaxy (MBE). The InP cap layer 4 may be formed through epitaxial growth by MBE or may be formed through epitaxial growth by metal organic vapor phase epitaxy (MOVPE) after the diffusion concentration distribution control layer 14 is grown by MBE and then taken out of MBE equipment.

An n-type electrode 12 is formed on the n-type InP substrate 1 so as to achieve ohmic contact. To impart n-type conductivity to the InP substrate 1, an n-type impurity such as Si is preferably contained in a certain amount or more. For example, an n-type dopant such as Si is preferably contained at about $1 \times 10^{17}/cm^3$ or more. The light-receiving layer 3 having a type-II MQW structure of InGaAs/GaAsSb, the diffusion concentration distribution control layer 14 composed of InGaAs, and the InP cap layer 4 are preferably undoped, but may be doped with an n-type dopant such as Si in a trace amount (for example, about $2\times10^{15}/cm^3$).

In FIG. 1, the pn junction 15 is broadly interpreted as described below. In the light-receiving layer 3, a region located on the side opposite a side doped with a p-type impurity element, Zn, by selective diffusion has a low impurity concentration and therefore is an impurity region (referred to as an i region) which can be regarded as an intrinsic semiconductor. The pn junction 15 includes junctions formed between the i region and the p-type region 6 into which the p-type impurity has been introduced by diffusion. That is, the pn junction 15 may include a pi junction or the like and may further include a pi junction having an extremely low p-type impurity concentration. It is illustrated in FIG. 1 that the pn junction 15 is present in the diffusion concentration distribution control layer 14. However, the Zn concentration has to be lowered in the light-receiving layer 3 as described above. In reality, Zn with a very low concentration reaches the light-receiving layer 3 and the above-described pn junction or pi junction is formed. The pn junction 15 of FIG. 1 indicates the boundary of a region where a p-type impurity concentration is a certain concentration or higher.

As described above, the p-type region 6 is formed by selectively diffusing Zn from the opening of the SiN selective diffusion mask pattern 36 formed on the surface of the InP cap layer 4 so that Zn reaches the light-receiving layer 3 having an MQW structure of InGaAs/GaAsSb. The edge portion of the p-type region 6 forms the pn junction 15. Herein, a high-concentration region with a Zn concentration of about $1\times10^{18}/cm^3$ or more is preferably limited within the InGaAs diffusion concentration distribution control layer 14. That is, the impurity with high concentration is continuously distributed from the surface of the InP cap layer 4 to the inside of the InGaAs diffusion concentration distribution control layer 14 in the depth direction, and the concentration of the impurity is decreased to $5\times10^{16}/cm^3$ or less at a deep position of the diffusion concentration distribution control layer 14. The distribution of the Zn concentration around the pn junction 15 is a distribution that indicates a graded junction.

According to the above-described manufacturing method, the adjacent light-receiving elements of the photodiode array 50 are separated from each other by selectively diffusing Zn (by diffusing Zn into the inside of the periphery of a light-receiving element in a limited manner when viewed in plan) without performing mesa etching for element separation. That is, the region 6 into which Zn has been selectively diffused is a main part of one of the pixels P, and a region into which Zn is not diffused separates the pixels P. Accordingly, dark current can be suppressed while avoiding damage to a crystal caused by mesa etching.

When the pn junction 15 is formed by selectively diffusing an impurity, the impurity diffuses not only in the depth direction but also in the horizontal direction (the direction perpendicular to the depth direction). Thus, there is a concern that elements have to be arranged at a certain interval or more. However, when the selective diffusion of Zn was actually performed, it was confirmed that the degree of the diffusion in the horizontal direction was within the degree of the diffusion in the depth direction in a structure in which the InP cap layer 4 is formed as an outermost layer and the InGaAs diffusion concentration distribution control layer 14 is formed below the InP cap layer 4. In other words, Zn is diffused into a region larger than the diameter of the opening of the selective diffusion mask pattern 36 in the horizontal direction, but the degree of the diffusion is small. As shown in FIG. 1, the region in the horizontal direction is only slightly lager than the opening of the selective diffusion mask pattern 36.

Second Embodiment

Figure 5:
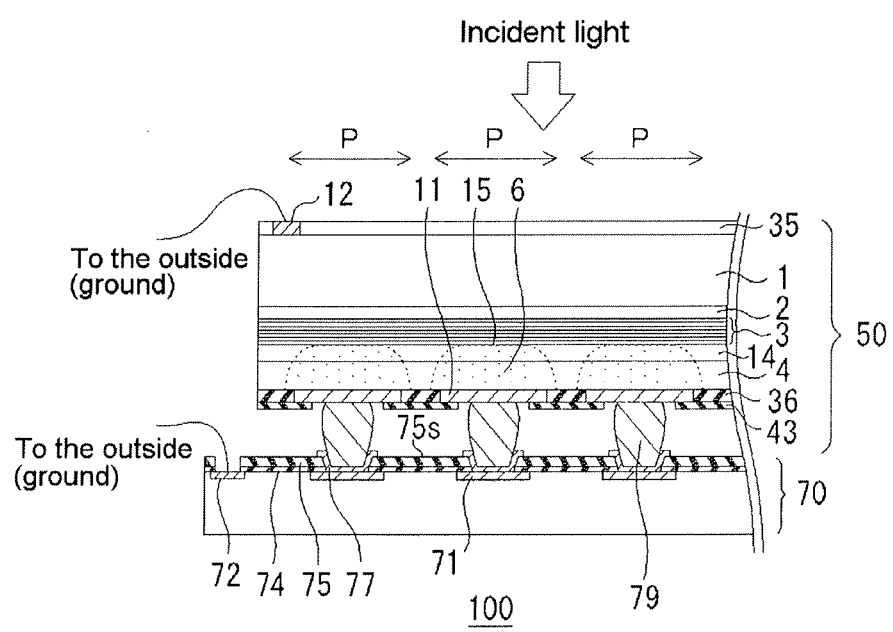
FIG. 5 is a sectional view showing a detection device according to a second embodiment of the present invention.

FIG. 5 is a sectional view showing a detection device 100 according to a second embodiment of the present invention. In the detection device 100 of this embodiment, a bump 79 is formed only on a CMOS 70 and no bump is formed on a photodiode array 50. The bump 79 formed on an electrode 71 of the CMOS 70 is directly electrically connected to a p-side electrode 11 of the photodiode array 50 by compression bonding. Thus, the height of the bump 79 formed on the CMOS 70 is increased. That is, in the electrolytic plating shown in FIG. 4B, the bump 79 is caused to grow taller so that the edge portion reaches a higher position. To achieve this, the thickness of the resist pattern M is preferably slightly increased. The structure of other portions is the same as that of the detection device 100 shown in FIG. 1.

In the detection device 100 of this embodiment, no bump is formed on the photodiode array 50. Thus, the manufacturing process can be simplified. Furthermore, since the bump 79 formed on only one side is precisely guided by the opening of the resist pattern M as described above, the shape and position of the bump 79 are highly precise. If bumps are formed on both sides so as to face each other, there may be a case where the bumps do not contact each other from the front and contact each other in a misaligned manner and thus may be deformed. Such deformation is caused even if the bumps on both sides are formed with high precision. As a result, a short circuit is generated between the adjacent bumps.

In this embodiment, since the bump 79 is formed only on one side with high precision, such a short circuit can be prevented with certainty and a high-quality image can be obtained. In addition, the above-described effects (E1) to (E3) achieved by the resin layer 75 can be produced.

Third Embodiment

Figure 6:
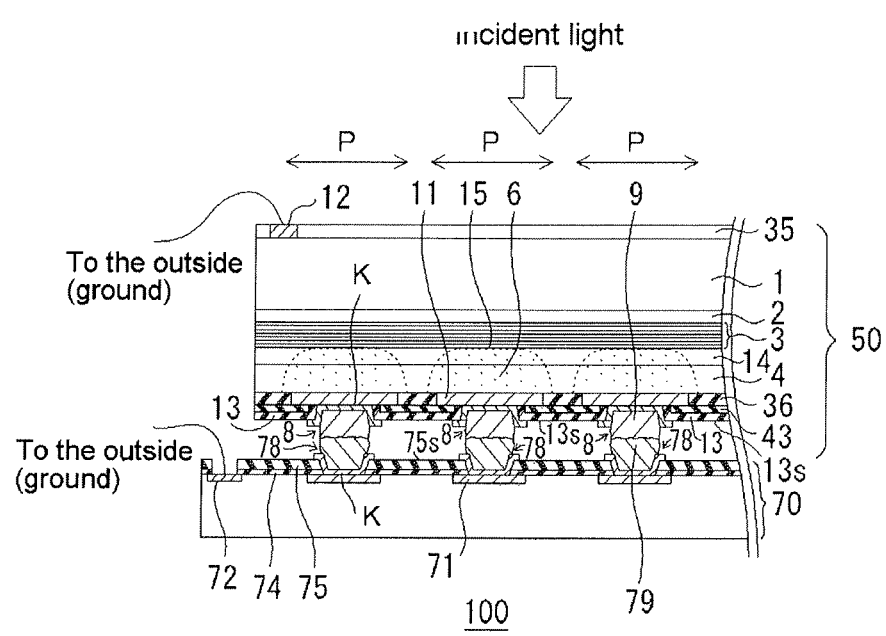
FIG. 6 is a sectional view showing a detection device according to a third embodiment of the present invention.

FIG. 6 is a sectional view showing a detection device 100 according to a third embodiment of the present invention. The detection device 100 of this embodiment has a feature in that the bumps 9 and 79 below are formed on a photodiode array 50 and a CMOS 70, respectively, and the bumps 9 and 79 are compression-bonded to each other.

Bump 9 of photodiode array 50: surface of cap layer 4/selective diffusion mask pattern 36 and passivation film 43/resin layer 13/cup-shaped metal K in opening 8/bump 9 formed by electrolytic plating Bump 79 of CMOS 70: surface of CMOS main body 70a/protective film 74/resin layer 75/cup-shaped metal K in opening 78/bump 79 formed by electrolytic plating The bumps 9 and 79 having the above-described structures each have the advantages described in the first embodiment. The differences are the following two points.

1. The surfaces 13s and 75s of the resin layers 13 and 75 face each other, the surfaces having a high roughness. That is, the surfaces 13s and 75s having a high roughness are arranged in parallel. Light that causes crosstalk in the case where there is no surface having a high roughness is first scattered at the surface 13s, having a high roughness, of the resin layer 13 of the photodiode array 50. Thus, the light does not easily reach the CMOS 70 side. Even if light (only a small amount) reaches the CMOS 70 through the photodiode array 50, the crosstalk can be prevented with certainty due to the surface 75s of the resin layer 75 having a high roughness. In other words, the crosstalk can be thoroughly suppressed.

2. since both the bumps 9 and 79 are formed by electrolytic plating, they can be easily caused to grow taller and the shape and position thereof are highly precise. Thus, by increasing the width of the edge portions of the bumps, the compression bonding can be completed through the rubbing of the edge portions without increasing the distance of a stroke of the compression bonding. That is, the bumps can be easily connected to each other without causing the irregular contact of the bumps, a short circuit, and the like.

Other Embodiment

The description about the detection device has been made. However, the present invention is not limited to the detection device and can be applied to any electronic apparatus in which electrodes are electrically connected to each other using a bump.

The embodiments of the present invention have been described above, but the embodiments of the present invention disclosed above are mere examples and the scope of the present invention is not limited to these embodiments. The scope of the present invention is defined by the appended claims, and all changes that fall within the scope of the claims and the equivalence thereof are therefore embraced by the claims.

According to the present invention, in a detection device such as a hybrid-type image pickup device in which compression bonding is performed using a bump, the contact resistance of electrode/bump can be reduced, the bonding strength can be increased, and the damage to a main body of a photodiode array or the like is not easily caused. Since a bump can be formed with high precision, the advantages can be further achieved at finer pitches.

What is claimed is:

1. A detection device including a photodiode array having a plurality of light-receiving elements arranged in a compound semiconductor that has light-receiving sensitivity in a near infrared region and a read out circuit configured to read out a photoinduced charge for each of the light-receiving elements, an electrode of the photodiode array and an electrode of the read out circuit being connected to each other through one or two bumps, the detection device comprising, in at least one of the photodiode array and the read out circuit:
  a resin layer that has an opening formed in a portion corresponding to the electrode and covers a surface on the side where the electrode is formed;
  a cup-shaped metal that is formed of a cup-shaped metal layer and covers the electrode and a wall surface of the opening of the resin layer; and
  a bump formed by electrolytic plating and located so as to fill the cup-shaped metal;
  wherein the resin layer is located on a passivation film that protects the surface on the side where the electrode is located.

2. The detection device according to claim 1,
  wherein the read out circuit has the bump formed on the cup-shaped metal by electrolytic plating, and
  (1) the photodiode array is connected to the bump of the read out circuit through a bump formed on the electrode of the photodiode array by a gas phase process, (2) no bump is formed on the electrode of the photodiode array and the bump of the read out circuit is directly electrically connected to an electrode of each of the light-receiving elements, or (3) the photodiode array is connected to the bump of the read out circuit through a bump formed on the cup-shaped metal of the photodiode array by electrolytic plating.

3. The detection device according to claim 1, wherein the opening of the resin layer is tapered in the portion corresponding to the electrode.

4. The detection device according to claim 1, wherein the resin layer has a surface roughness Ra of 0.5 to 1 μm.

5. The detection device according to claim 1, wherein the bump is composed of In.

6. The detection device according to claim 1, wherein the resin layer is composed of a photosensitive polyimide resin or a BCB resin.

7. The detection device according to claim 1,
  wherein the photodiode array includes an InP substrate and a light-receiving layer formed on the InP substrate and having a band gap wavelength of 1.65 to 3.0 μm,
  the light-receiving layer has a type-II multi-quantum well structure of (GaAsSb/InGaAs) or a type-II multi-quantum well structure of (GaAsSb/InGaAsN), (GaAsSb/InGaAsNP), or (GaAsSb/InGaAsNSb), and
  the light-receiving layer satisfies a lattice matching condition $|\Delta a/a| \leq 0.002$ (where ai is a lattice constant of each layer in the light-receiving layer, a is a lattice constant of the InP substrate, and $\Delta a = ai - a$) so as to achieve lattice matching with the InP substrate.

8. The detection device according to claim 1,
  wherein the photodiode array includes an InP substrate and a light-receiving layer formed on the InP substrate and having a band gap wavelength of 1.65 to 3.0 μm,
  the light-receiving layer is composed of InGaAs, InGaAsN, InGaAsNP, or InGaAsNSb, and
  the light-receiving layer satisfies a lattice matching condition $|\Delta a/a| \leq 0.002$ (where ai is a lattice constant of the light-receiving layer, a is a lattice constant of the InP substrate, and $\Delta a = ai - a$) so as to achieve lattice matching with the InP substrate.

9. A photodiode array having a plurality of light-receiving elements arranged in a compound semiconductor that has light-receiving sensitivity in a near infrared region, the photodiode array comprising:
  a mask pattern configured to selectively diffuse a p-type impurity;
  a resin layer located on the mask pattern and having an opening formed in a portion corresponding to an electrode that is formed for each of the light-receiving elements;
  a cup-shaped metal that is formed of a cup-shaped metal layer and covers the electrode and a wall surface of the opening of the resin layer; and
  a bump formed by electrolytic plating and located so as to fill the cup-shaped metal,
  wherein the light-receiving elements each have a pn junction formed by selectively diffusing the p-type impurity from an outer layer of an epitaxial layered body of the compound semiconductor and are separated from each other by a region into which no p-type impurity is selectively diffused, and
  the electrode is formed in a p-type region into which the p-type impurity is selectively diffused so as to achieve ohmic contact.

10. The photodiode array according to claim 9, wherein the resin layer is located on a passivation film that protects a surface on the side where the electrode is located.

11. The photodiode array according to claim 9, wherein the opening of the resin layer is tapered in the portion corresponding to the electrode.

12. The photodiode array according to claim 9, wherein the resin layer has a surface roughness Ra of 0.5 to 1 μm.

13. The photodiode array according to claim 9, wherein the bump is composed of In.

14. The photodiode array according to claim 9, wherein the resin layer is composed of a photosensitive polyimide resin or a BCB resin.

15. The photodiode array according to claim 9,
wherein the photodiode array includes an InP substrate and a light-receiving layer formed on the InP substrate and having a band gap wavelength of 1.65 to 3.0 μm,
the light-receiving layer has a type-II multi-quantum well structure of (GaAsSb/InGaAs) or a type-II multi-quantum well structure of (GaAsSb/InGaAsN), (GaAsSb/InGaAsNP), or (GaAsSb/InGaAsNSb), and
the light-receiving layer satisfies a lattice matching condition $|\Delta a/a| \leq 0.002$ (where $a_i$ is a lattice constant of each layer in the light-receiving layer, a is a lattice constant of the InP substrate, and $\Delta a = a_i - a$) so as to achieve lattice matching with the InP substrate.

* * * * *